United States Patent [19]

Hong

[11] Patent Number: 5,574,997
[45] Date of Patent: Nov. 12, 1996

[54] AUTO-SELECTING CIRCUIT OF AN INTERMEDIATE FREQUENCY

[75] Inventor: Young Pyo Hong, Suwon, Rep. of Korea

[73] Assignee: Samsung Electronics Co., Ltd., Kyungki-do, Rep. of Korea

[21] Appl. No.: 352,625

[22] Filed: Dec. 9, 1994

[30] Foreign Application Priority Data

Jun. 9, 1994 [KR] Rep. of Korea ...................... 94-12944

[51] Int. Cl.$^6$ ...................................................... H04B 1/16
[52] U.S. Cl. ..................... 455/180.1; 455/190.1; 348/731
[58] Field of Search ............................. 455/180.1, 180.2, 455/187.1, 188.1, 189.1, 190.1, 191.1, 192.1, 192.2, 196.1; 348/731, 732, 735

[56] References Cited

U.S. PATENT DOCUMENTS

| 4,592,093 | 5/1986 | Ouchi et al. | 455/189.1 |
| 5,263,182 | 11/1993 | Park | 455/188.1 |

FOREIGN PATENT DOCUMENTS

| 3-187623 | 8/1991 | Japan | 455/188.1 |
| 4-212527 | 8/1992 | Japan | 455/188.1 |
| 5-218894 | 8/1993 | Japan | 455/188.1 |

Primary Examiner—Chi H. Pham
Attorney, Agent, or Firm—Sughrue, Mion, Zinn, Macpeak & Seas

[57] ABSTRACT

A circuit for automatically selecting an intermediate frequency which includes a single tuner having a plurality of local oscillators. The circuit amplifies a channel frequency received by an antenna and mixes it with a local oscillating frequency output from a designated local oscillator to output an intermediate frequency. The circuit also has a microprocessor which outputs a control signal to select a local oscillator for a particular broadcasting system from among the plurality of local oscillators, a switching circuit which selects an oscillating frequency of the designated local oscillator according to the control signal output from the microprocessor and outputs it to the mixer of the tuner, and a detector of an intermediate frequency which amplifies the intermediate frequency of the tuner to detect image signals and sound signals. The plurality of local oscillators for particular broadcasting systems are equipped in a single tuner, and an oscillating frequency output from a local oscillator suitable for a particular broadcasting system is selected. Cost of manufacture can be reduced, the circuit structure can be simplified, and the size of the receiving apparatus can be miniaturized because the intermediate frequency suitable for a particular broadcasting system is automatically output from a single tuner.

4 Claims, 2 Drawing Sheets 5,574,997

AUTO-SELECTING CIRCUIT OF AN INTERMEDIATE FREQUENCY

BACKGROUND OF THE INVENTION

1. Field of the Invention

This invention relates to a circuit for automatically selecting an intermediate frequency. More particularly, it relates to a circuit which automatically selects and outputs an intermediate frequency suitable for a particular broadcasting system by providing multiple local oscillators, each of which are suitable for a specific broadcasting system.

2. Description of the Prior Art

FIG. 1 is a block diagram showing a conventional television receiving apparatus. In FIG. 1, a high channel frequency is received by an antenna and is amplified by a high frequency amplifier portion 101 in a tuner 100 and is output through a mixer 103. The mixer 103 mixes the high channel frequency amplified from the high-frequency amplifier portion 101 with an oscillating frequency output from a local oscillator 105 and outputs the difference frequency of these signal frequencies. In other words, the output of the local oscillator 105 minus the output of the high frequency amplifier portion 101 equals the frequency of the output of the mixer 103, which is an intermediate frequency IF.

The main purpose of high frequency amplification is to prevent local oscillating power from leaking outside. The local oscillator 105 oscillates at a higher frequency than that of the image carrier wave frequency of the received channel. The local oscillating frequency is as high as an image intermediate frequency. The output of the mixer 103 is input to a Phase Lock Loop (PLL) Portion 107. The PLL 107 accurately synchronizes an intermediate frequency with a predetermined channel frequency and outputs it to an intermediate frequency amplifier 300 by means of serial clocks (SCLs) and serial data (SDA) output by a microprocessor 200. The intermediate frequency amplifier 300 amplifies the intermediate frequency and outputs it to an image processor 400 and a sound multiplex processor 500 in order to obtain image detecting waves and sound signals. The image processor 400 detects a luminance signal, a carrier wave color signal, and a synchronizing signal among the intermediate frequency signals amplified by the intermediate frequency amplifier 300. The sound multiplex processor 500 detects an FM sound signal by means of a 4.5 Mz sound detection circuit.

In FIG. 1, the intermediate frequencies are different from each other, and depend on a particular broadcasting system of each broadcasting station. To output an intermediate frequency suitable for a particular broadcasting system, a separate tuner for respectively outputting a different intermediate frequency needs to be developed for each broadcasting system corresponding to each appliance (Television, Video, VCR). Therefore, simplification of design is difficult and an export market is limited.

On the other hand, U.S. Pat. No. 5,014,349, TELEVISION TUNER FOR COMMON USE IN BC/UV, shows the technology to simplify the circuit and to reduce the expense of manufacturing the circuit by making common use of a double super type tuner which receives a TV signal in the VHF/UHF band and/or a CATV signal, and a BS tuner which receives a broadcast signal from a satellite TV by means of a switching circuit. In this prior art, when at least one of a VHF/UHF band TV signal and a CATV signal is input as a first input signal and a BS IF signal is input through the frequency conversion of the satellite TV broadcast signal as a second input signal, a tuner portion is made in the form of a double super type of an up/down system so as to receive the TV signal of the VHF/UHF band and/or the CATV signal.

The double super type tuner includes an up-converter comprising a first partial oscillator and a first mixer, and a down-converter comprising a second partial oscillator and a second mixer. After the satellite TV broadcast signal is input as the second input signal, the first partial oscillator and the first mixer are switched by a switching circuit and used as the down-converter. Therefore, making common use of the first partial oscillator and the first mixer for reception of the TV signal of the VHF/UHF band and/or the CATV signal and for reception of a satellite TV broadcast signal by the switching circuit results in simplifying the structure, cutting down expenses, and miniaturizing the receiver.

However, even though the technology makes common use of the receiving tuner for the TV signal of the VHF/UHF band and/or the CATV signal, and the satellite TV broadcast signal and results in simplifying the structure, reducing expenses, and miniaturizing the receiver, in order to output the intermediate frequency for a particular broadcasting system this technology still has a disadvantage in that a plurality of tuners are required.

SUMMARY OF THE INVENTION

An object of this invention is to solve the above problems and to reduce expenses by providing a circuit for auto-selecting an intermediate frequency, wherein the apparatus is simplified by providing multiple local oscillators, each of which is suitable for a different particular broadcasting system, by selecting a local oscillator system which is suitable for a particular broadcasting system, and by automatically outputting an intermediate frequency which corresponds to a particular station broadcasting system.

To accomplish the above object, the auto-selecting circuit of the intermediate frequency comprises multi-local oscillators, a tuner for amplifying a channel frequency selected by an antenna and mixing it with a local oscillating frequency output by a predetermined local oscillator to output an intermediate frequency, a microprocessor for providing a control signal to select a local oscillator from among the plurality of local oscillators for a particular broadcasting system, a switching means for selecting an oscillator by means of the control signal output from the microprocessor to output it to the mixer of the tuner, and a detecting wave means for amplifying the intermediate frequency of the tuner to detect whether it is an image signal or a sound signal.

DETAILED DESCRIPTION OF THE PREFERRED EMBODIMENT OF THE INVENTION

Figure 1:
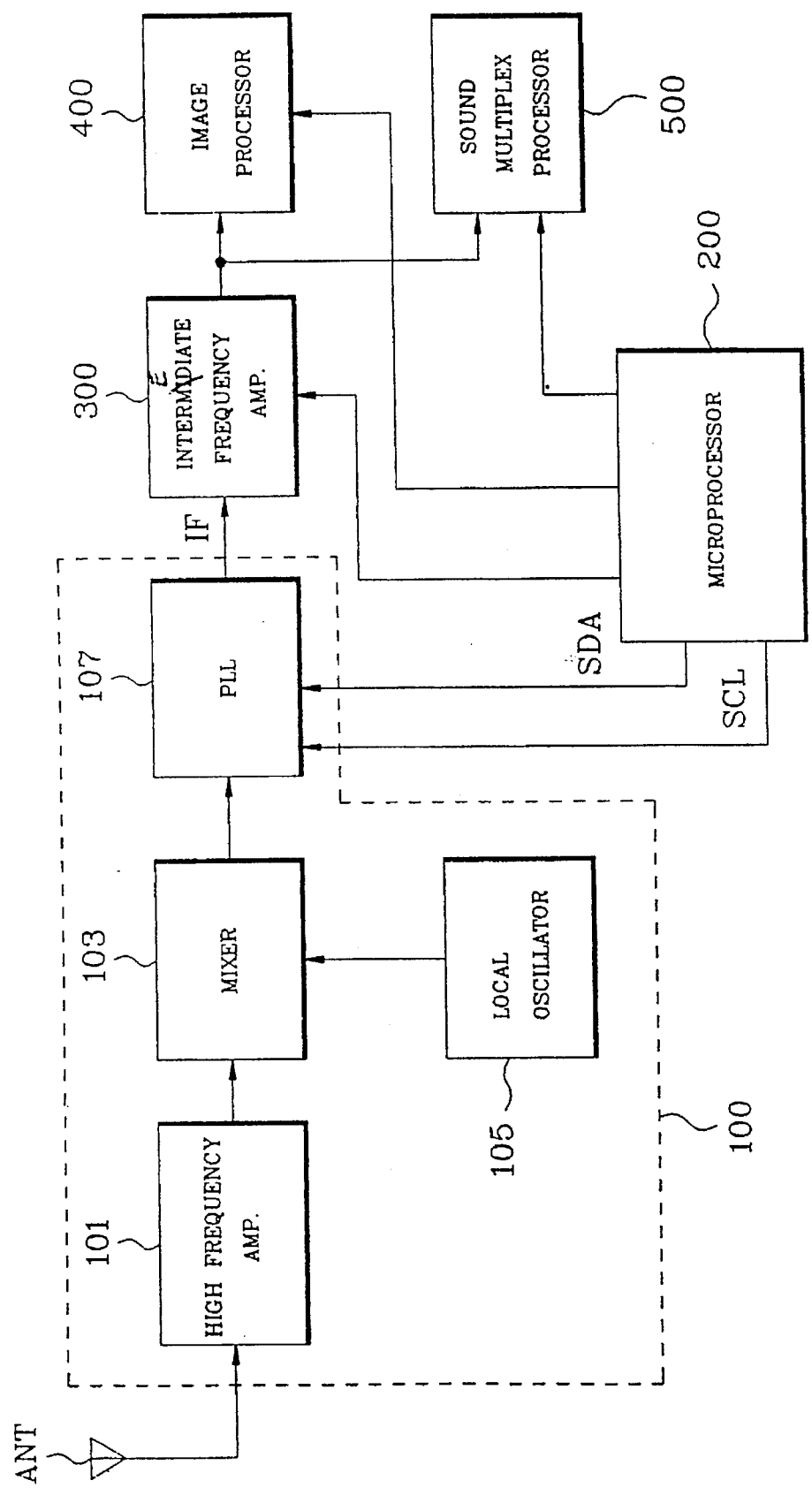
FIG. 1 is a block diagram showing a conventional television receiving apparatus.
Figure 2:
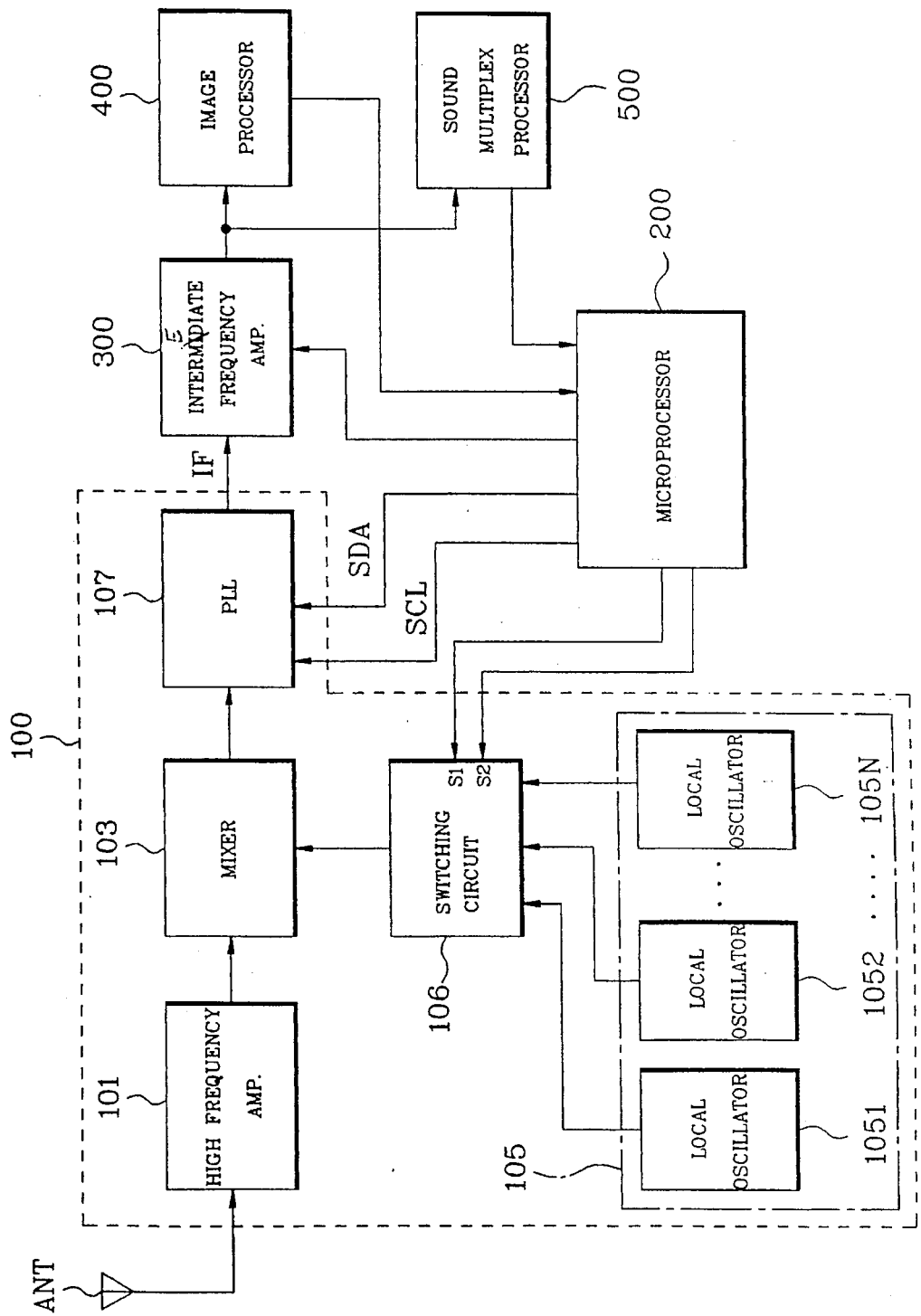
FIG. 2 is a block diagram of an auto-selecting circuit of an intermediate frequency according to this invention.

FIG. 2 is a block diagram of a circuit for auto-selecting an intermediate frequency according to this invention, in which explanations of the same components and arrangements as shown in FIG. 1 are left out, and in which the same reference symbols are used for the same elements.

In reference to FIG. 2, only the tuner 100 will be described, because the other elements in FIG. 1 are the same as those in FIG. 2. In the tuner 100, a high frequency amplifier 101 which amplifies a channel frequency received by an antenna is connected to a mixer 103 which outputs an intermediate frequency. The mixer 103 mixes a high channel frequency amplified from the high frequency amplifier 101 and an oscillating frequency output from a local oscillator 105, and outputs a difference of these frequencies as an intermediate frequency. The local oscillator 105 is comprised of various local oscillators 1051–105N for particular station broadcasting systems (PAL, NTSC, SECAM, etc.)

An output of the local oscillator 105 is connected to a switching circuit 106, and the switching circuit 106 selects a local oscillator output from the local oscillator 105 by means of a control signal output from the microprocessor 200 and outputs it to the mixer 103. An output band of the mixer 103 is connected to a PLL 107, so that the PLL 107 accurately synchronizes an intermediate frequency with a predetermined channel frequency and outputs it to an intermediate frequency amplifier 300 by means of serial clock (SCL) and serial data (SDA) output from the microprocessor 200.

Once a channel frequency is received through the antenna, it is amplified in the high frequency amplifier 101, and then is output to the mixer 103. The microprocessor 200 outputs a predetermined control signal to the switching circuit 106 so that the signal oscillated in the first oscillator 1051 may be transmitted to the mixer 103. The control signal is output according to the number of the local oscillators 1051–105N. For example, the control signal can be output from two lines if there are four local oscillators ($2^2=4$). The switching circuit 106 connects the first local oscillator to the mixer 103 according to the control signal (for example, "00") of the microprocessor 200.

The oscillated output of the first local oscillator 1051 is transmitted to the mixer 103 to be mixed with the output of the high frequency amplifier 101 and thereby the intermediate frequency which is the difference frequency of both signals is output to the PLL 107. The PLL 107 accurately synchronizes the intermediate frequency output from the mixer 103 with a predetermined channel frequency and outputs it to an intermediate frequency amplifier 300 according to a serial clock SCL and serial data SDA output from a microprocessor 200.

The intermediate frequency amplifier 300 amplifies the intermediate frequency and outputs it to an image processor 400 and a sound multiplex processor 500 in order to get an image detecting wave output and a sound signal. The image processor 400 checks for the existence of a signal corresponding to the local broadcasting system, and the sound multiplex processor 500 checks whether the intermediate frequency corresponds to the local sound multiplex system and outputs a signal to the microprocessor 200 if there is correspondence.

The image processor 400 discriminates the existence of a broadcasting system by sequentially checking several channels, and the sound multiplex processor 500 outputs a pilot signal to the microprocessor 200 if it corresponds to the local sound multiplex system. If the intermediate frequency output from the first local oscillator 1051 does not correspond to the local broadcasting system and the sound multiplex system, the microprocessor 200 outputs a predetermined control signal (for example, "01") to the switching circuit 106 again and causes it to select the second local oscillator 1052.

The switching circuit 106 connects the second local oscillator to the mixer 103 under the control of the microprocessor 200. The mixer 103 mixes the output of the high frequency amplifier 101 and the output of the second local oscillator 1052, and outputs its intermediate frequency which is the difference frequency of both signals to the PLL 107. As above, the PLL 107 accurately synchronizes the intermediate frequency output from the mixer 103 with a predetermined channel frequency for output to an intermediate frequency amplifier 300 according to the serial clock SCL and serial data SDA. The intermediate frequency amplifier 300 amplifies the intermediate frequency and outputs it to an image processor 400 and a sound multiplex processor 500 in order to obtain an image detecting wave output and a sound signal.

A method for checking the presence or non-presence of a broadcast system by checking the intermediate frequency output by the oscillating frequency output from the second oscillator is performed in the same manner as above. When a signal indicating the presence of a broadcast system is input to the image processor 400, or the pilot signal is input to the sound multiplex processor 500, the microprocessor 200 controls the switching circuit 106 to maintain the present switched state of the second local oscillator 1052.

According to the circuit for auto-selecting an intermediate frequency of this invention, a plurality of local oscillators, each for a particular broadcasting system, are equipped in a single tuner, and an oscillating frequency output from a local oscillator suitable for a particular broadcasting system is selected. Therefore, expenses can be reduced, the circuit structure can be simplified, and the size of the receiving apparatus can be miniaturized because the intermediate frequency suitable for a particular broadcasting system is automatically output from a single tuner.

What is claimed is:

1. A circuit for automatically selecting an intermediate frequency comprising:

a single tuner, including a plurality of local oscillators and a mixer, said tuner amplifying a channel frequency received by an antenna and mixing the channel frequency with a local oscillating frequency output from one of said plurality of local oscillators to produce an intermediate frequency signal;

a microprocessor which outputs a control signal to designate said one of said plurality of local oscillators from among said plurality of local oscillators;

a switching circuit which selects an oscillating frequency output by the designated local oscillator according to the control signal output from said microprocessor, and outputs the selected oscillating frequency to said mixer of said tuner; and a detector of an intermediate frequency, said detector including:
an image signal detector for detecting image signals from said intermediate frequency signal and outputting an image signal detecting signal; and
a sound signal detector for detecting sound signals from said intermediate frequency signal and outputting a sound signal detection signal;

wherein said microprocessor receives the image signal detecting signal and the sound signal detecting signal and outputs the control signal to designate said one of said plurality of local oscillators from among said plurality of local oscillators according to the image signal detecting signal and the sound signal detecting signal.

2. A circuit as claimed in claim 1, wherein said image signal detecting signal indicates the presence or non-presence of said image signals in the intermediate frequency signal, and said sound signal detecting signal indicates the presence or non-presence of sound signals in the intermediate frequency signal.

3. A circuit as claimed in claim 2, wherein the presence or non-presence of said image signals in the intermediate frequency indicates, respectively, a correspondence or non-correspondence of the intermediate frequency signal with a local broadcasting system, and the presence or non-presence of sound signals in the intermediate frequency indicates, respectively, a correspondence or non-correspondence of the intermediate frequency signal with a local sound multiplex system.

4. A circuit as claimed in claim 3, wherein said microprocessor controls said switching circuit to sequentially designate each of said plurality of local oscillators until a specific local oscillator is designated which results in one of:

said image signal detecting signal indicating the presence of said image signals in the intermediate frequency signal, and said sound signal detecting signal indicating the presence of said sound signals in the intermediate frequency signal, whereupon said microprocessor ceases the sequential designation of each of said plurality of local oscillators and continues to designate the specific local oscillator.

* * * * *